United States Patent [19]
Sanemitsu

[11] Patent Number: 5,568,441
[45] Date of Patent: Oct. 22, 1996

[54] IC CARD

[75] Inventor: Yoshikado Sanemitsu, Itami, Japan

[73] Assignee: Mitsubishi Denki Kabushiki Kaisha, Tokyo, Japan

[21] Appl. No.: 518,458

[22] Filed: Aug. 23, 1995

[30] Foreign Application Priority Data

Sep. 27, 1994 [JP] Japan .................................. 6-231675

[51] Int. Cl.$^6$ ................................................ G11C 5/14
[52] U.S. Cl. ........................ 365/229; 365/228; 235/492
[58] Field of Search ................................. 365/228, 229, 365/226; 235/380, 441, 451, 492

[56] References Cited

U.S. PATENT DOCUMENTS

| | | | |
|---|---|---|---|
| 5,212,664 | 5/1993 | Shinohara | 365/228 |
| 5,343,436 | 8/1994 | Suzuki | 365/228 |

FOREIGN PATENT DOCUMENTS

| | | | |
|---|---|---|---|
| 60-140412 | 7/1985 | Japan | 365/229 |
| 4134788 | 5/1992 | Japan | 365/226 |

*Primary Examiner*—Tan T. Nguyen
*Attorney, Agent, or Firm*—Leydig, Voit & Mayer

[57] ABSTRACT

An IC card according to the present invention includes a lithium cell that, when the IC card is disconnected from a system, supplies power required for retention of data in a volatile static random access memory (SRAM); a first capacitor connected in parallel with the lithium cell in order to accumulate charge, a second capacitor connected in parallel with the lithium cell in order to accumulate charge, and a switch for connecting the first capacitor and the second capacitor in series with each other during replacement of the lithium cell. The series circuit of the first and second capacitors serves as a backup power source during replacement of the lithium cell. As a result, the time available for cell replacement without loss of stored data is increased.

16 Claims, 11 Drawing Sheets

IC CARD

BACKGROUND OF THE INVENTION

1. Field of the Invention

The present invention relates to an IC card with a power cell, such as, a memory card used for a personal computer.

2. Description of the Related Art

The configuration of a known IC card with a cell will be described in reference to FIG. 11. FIG. 11 shows the circuitry of a known IC card.

In FIG. 11, the known IC card 100 comprises a connector 1 to be connected to a system such as a personal computer (not show), a diode 2 for preventing outflow of current from a cell 8, a diode 3 for protecting the cell 8 from being charged by a power supply in the system over a power line 9, a volatile static random access memory (SRAM) 4 for storing data or the like, a large-capacity capacitor 5 for temporarily retaining a supply voltage 14 to be fed to the SRAM 4 when the cell 8 is removed, a contact 7 in the IC card to which the cell 8 is linked, and a 3-V lithium power cell 8 stowed in a cell holder.

In FIG. 11, the SRAM 4 is connected to the connector 1 over a data line 70, an address line 11, and a control signal line 12 for use in controlling the chip of the SRAM 4, and writing and reading. Reference numeral denotes a ground terminal. Reference numeral 15 denotes pull-up resistor.

Referring to FIG. 12, the operation of the known IC card will be described. FIG. 12 is a characteristic diagram showing the relationship between time and supply voltage for the SRAM 4.

Describe below is the operation for removing and replacing the dell 8 with the IC card 100 not connected to an external system. Normally, when the IC card 100 is connected to the system, the system monitors the voltage at the cell 8 in the IC card 100. When the voltage decreases to a given value (for example, about 2.5 V), the system outputs an alarm to a video screen or the like.

In response to the alarm, when the lithium cell 8 is removed, i.e., demounted for replacement, the supply voltage 14 ($V\alpha$) for the SRAM 4 is discharged according to the following formula 1:

$$V\alpha = V_b e^{-t/cr} \tag{1}$$

where Vb (volt) denotes the initial voltage of the cell 8, C (farad) denotes the capacitance of the capacitor 5, R (ohm) denotes the internal equivalent resistance of the SRAM 4, and t (second) denotes elapsed time. Herein, the forward voltage at the diode 3 is 0 V.

The formula is plotted as a curve $V\alpha$ in FIG. 12. Assuming that the minimum voltage required for the SRAM 4 to retain data is Vm (volt), in order to avoid loss of stored data, an IC card user must replace the lithium cell 8 with a new one by the time instant t1 at which the supply voltage 14 for the SRAM 4 that initially equals to the voltage Vb reaches the voltage Vm.

For example, after the alarm is given, if the IC card remains unused for a prolonged period of time, the voltage Vb may equal the voltage Vm with the passage of zero time t. The time interval t1 may therefore be 0 seconds at worst.

The aforesaid known IC card has such a problem in that the time available for replacing a cell is very short or nil, at worst.

SUMMARY OF THE INVENTION

The present invention attempts to solve the forgoing problem. An object of the present invention is to provide an IC card capable of making a prolonged period of time available for cell replacement and avoiding eventual data loss.

An IC card in accordance with the present invention comprises: connector means; volatile memory means connected to the connector means for storing data; a primary ceil for supplying power required for data retention to the memory means; a first current limiting element for preventing outflow of current from the primary cell via the connector means; a second current limiting element for protecting the primary cell from being charged externally via the connector means; charge accumulating means including a plurality of charge accumulation devices for accumulating charge supplied from the primary cell; and switch means for connecting the plurality of charge accumulation devices in parallel with the primary cell for normal operation, and for connecting the plurality of charge accumulation devices in series with one another for replacement of the primary cell.

For replacement of the primary cell, the series circuit composed of the plurality of charge accumulation devices serves as a backup. Consequently, the time required for cell replacement can be made longer. Eventual, data loss can be prevented.

In an IC card according to the present invention, when the primary cell is removed for replacement, the switching means connects, in interlocked fashion, the plurality of charge accumulation devices in series with one another.

Consequently, the intended object of the present invention can be accomplished merely by performing the simple work of demounting a cell.

In an IC card according to the present invention, the second current limiting element is interposed between the primary cell and charge accumulating means. This makes it possible to externally charge the plurality of charge accumulation devices of the charge accumulating means via the connector means.

When an external voltage is higher than the voltage at the primary cell, the time available for cell replacement can be made longer. Eventual, data loss is prevented.

In the IC card according to the present invention, the second current limiting element is situated among the plurality of charge accumulation devices. This makes it possible to externally charge any of the plurality of charge accumulation device is via the connector means.

When an external voltage is higher than the voltage at the primary cell the, time available for cell replacement is made longer. Eventual, data loss can be prevented.

3

Figure 8:
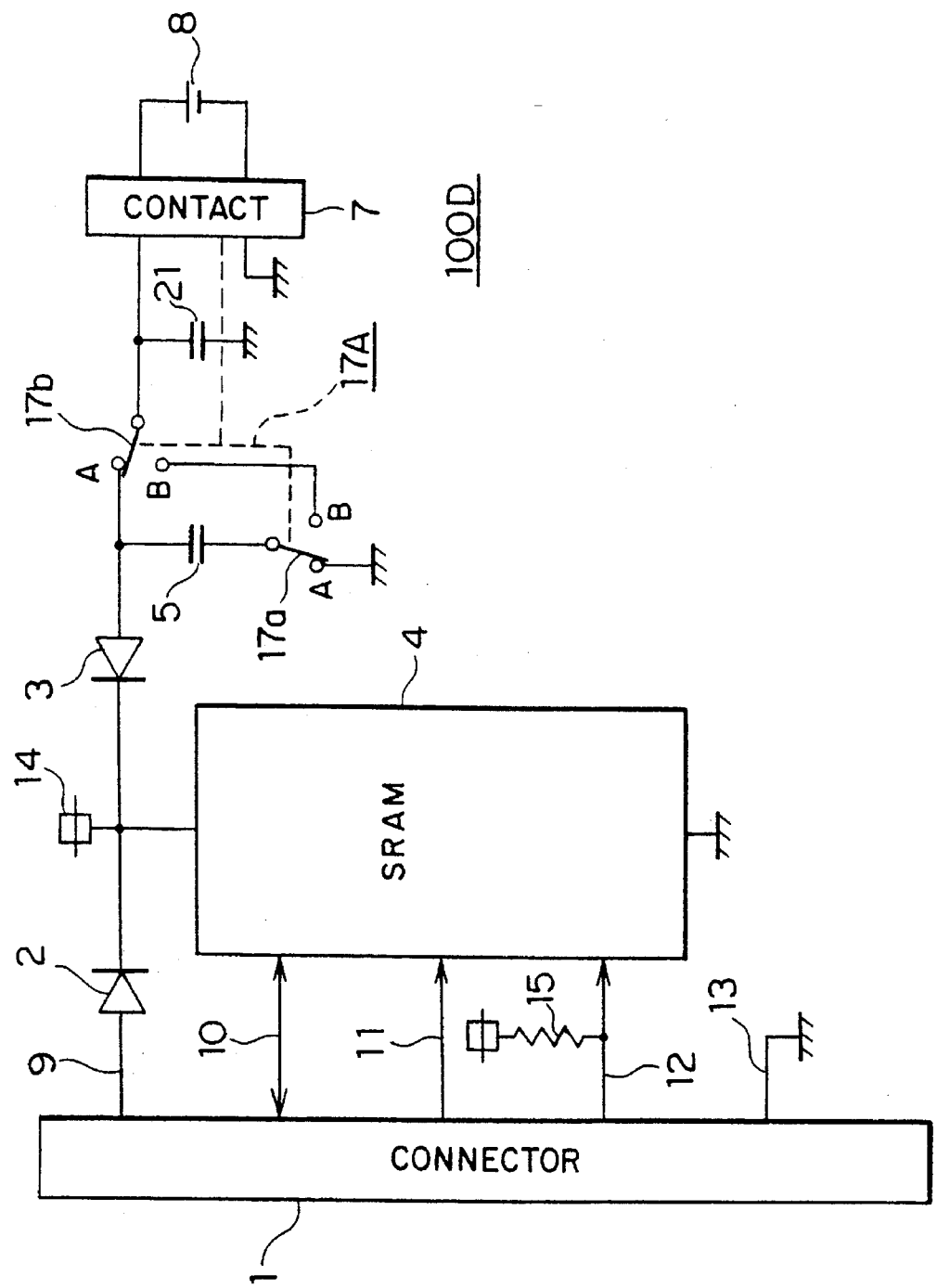
Figure 9:
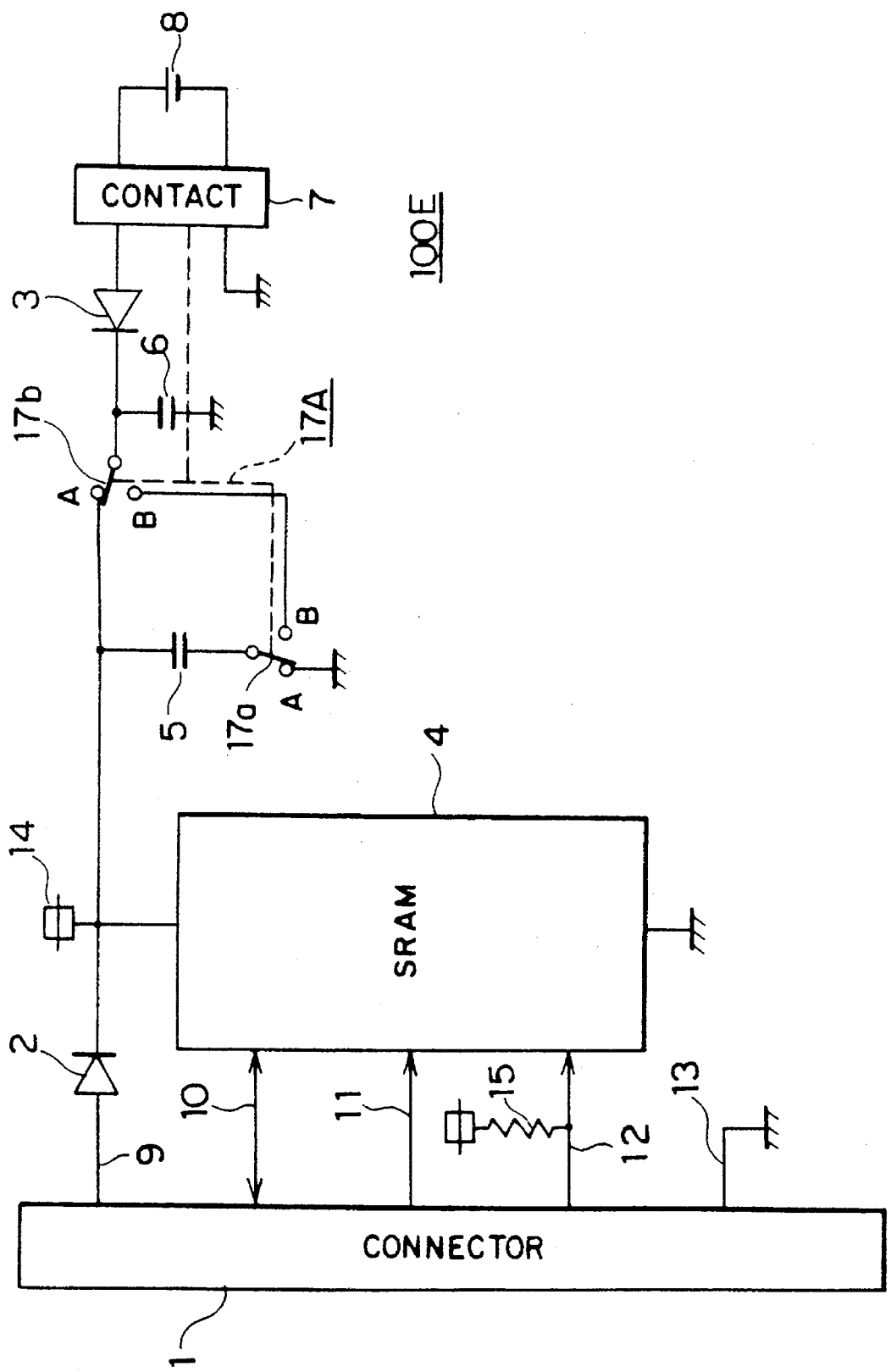
Figure 10:
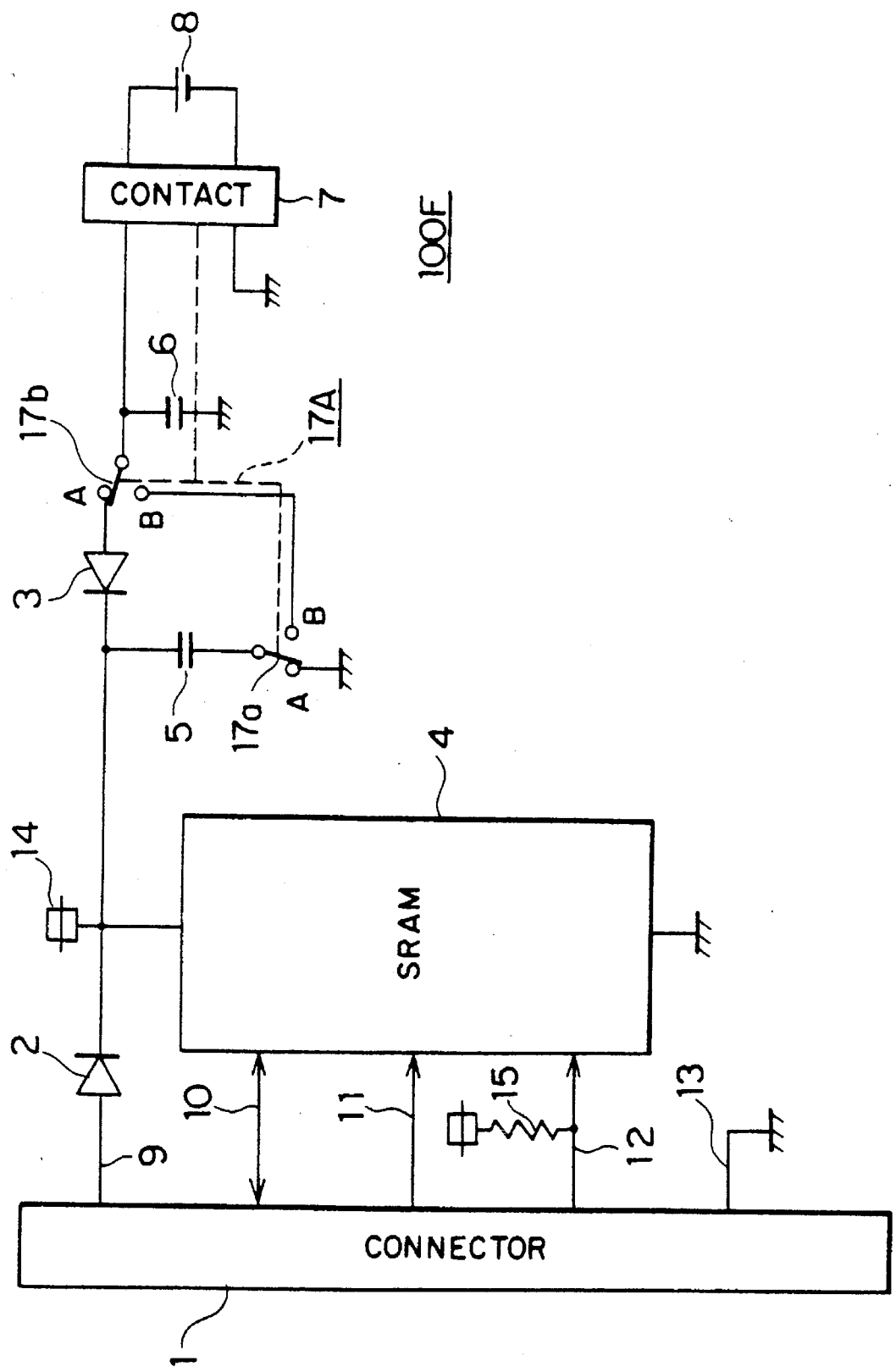
Figure 11:
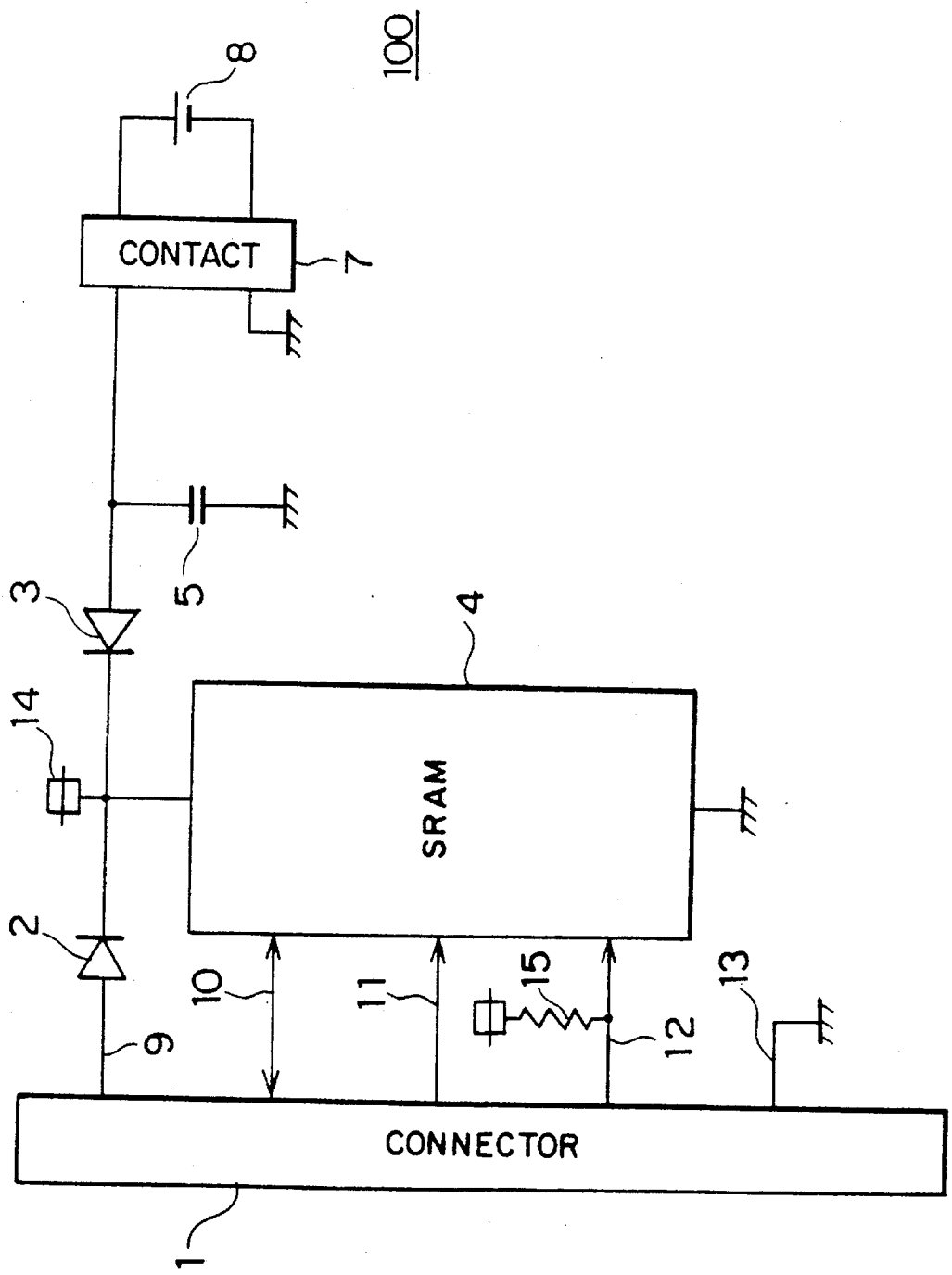

FIG. 8 shows the circuitry of an IC card in accordance with a fourth embodiment of the present invention;

FIG. 9 shows the circuitry of an IC card in accordance with a fifth embodiment of the present invention;

FIG. 10 shows the circuitry of an IC card in accordance with a sixth embodiment of the present invention;

FIG. 11 shows the circuitry of a privately known, unpublished IC card; and

Figure 12:
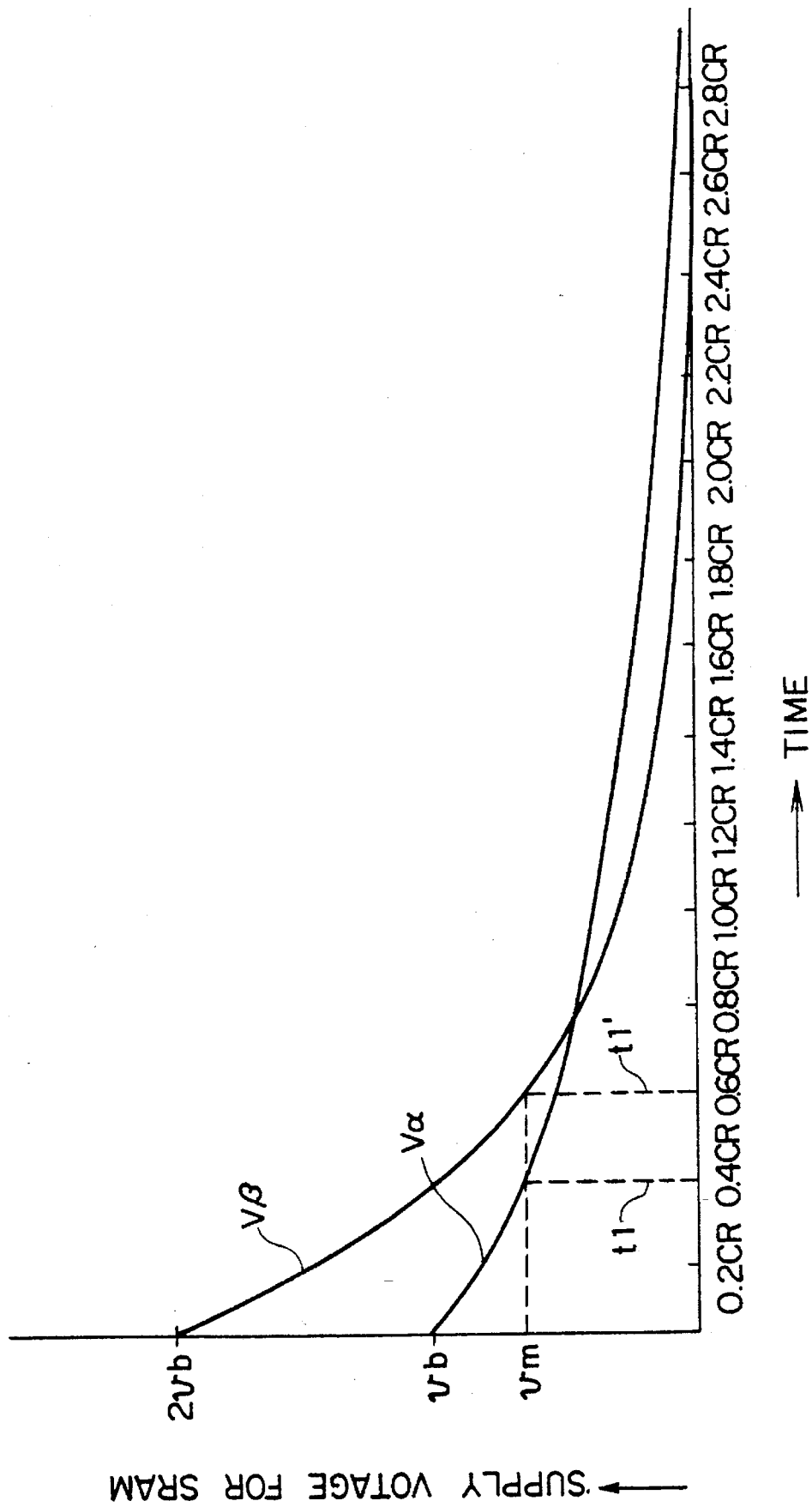

FIG. 12 is a characteristic diagram showing the relationship between time and supply voltage for a SRAM in the known IC card and the relationship between them in the first embodiment of the present invention.

DESCRIPTION OF THE PREFERRED EMBODIMENTS

First Embodiment

Figure 1:
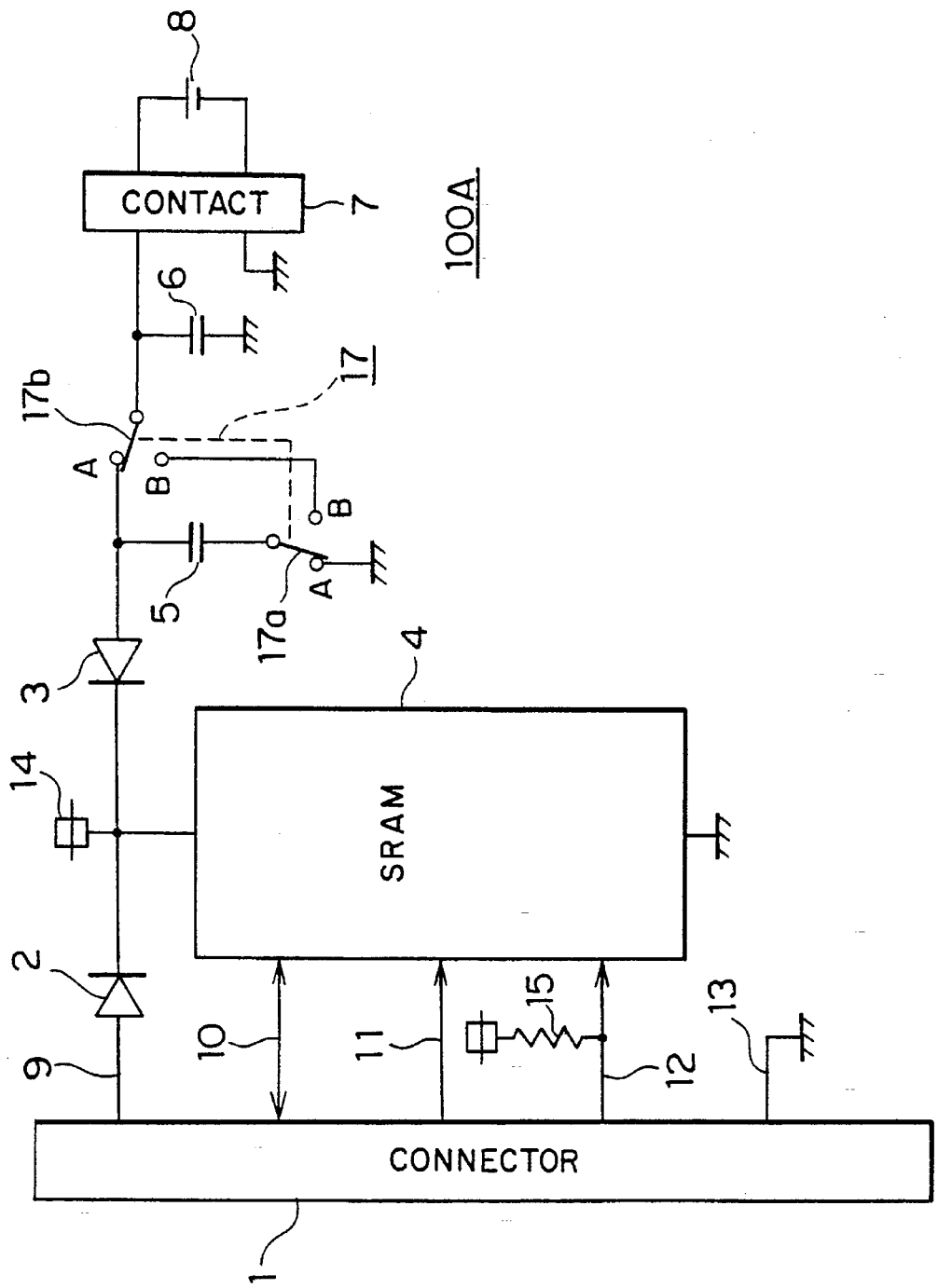
FIG. 1 shows the circuitry of an IC card in accordance with a first embodiment of the present invention.
Figure 2:
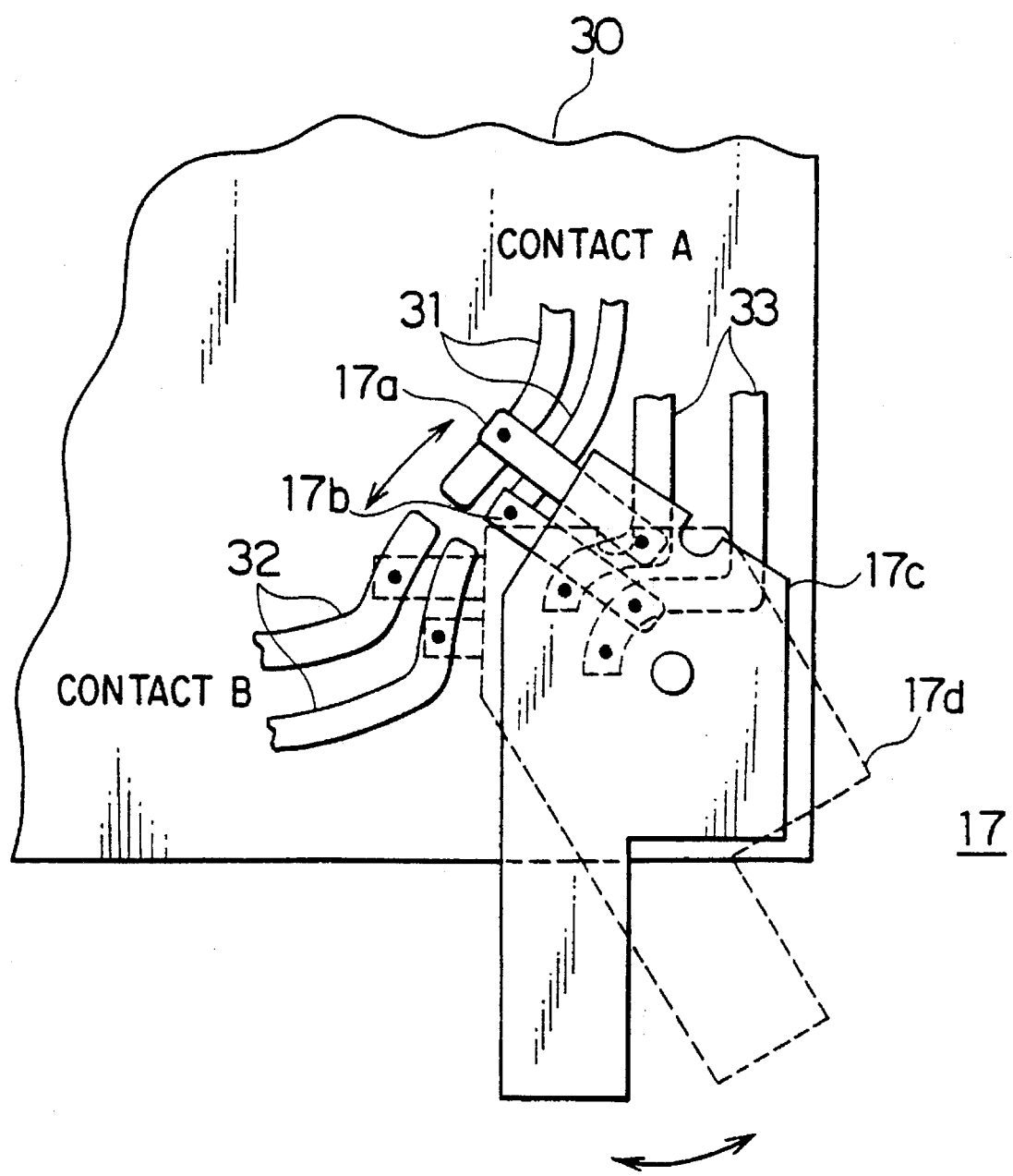
FIG. 2 shows the structure of a switch in the first embodiment of the present invention.

Referring to FIGS. 1 and 2, a first embodiment of the present invention will be described. FIG. 1 shows the circuitry of the first embodiment of the present invention. FIG. 2 shows the structure of a switch in the first embodiment. In the drawings, the same reference numerals denote the same or equivalent circuit elements.

In FIG. 1, an IC card 100A comprises a connector to be connected to a system such as a personal computer (not shown), a current limiting element (a diode or equivalent device) 2 for preventing outflow of current from a cell 8, a current limiting element (a diode or equivalent device) 3 for protecting the cell 8 from being charged by a power supply in the system over a power line 9, a volatile SRAM 4 for storing data or the like, large-capacity capacitors 5 and 6 for temporarily retaining a supply voltage 14 to be fed to the SRAM 4 when the cell 8 is demounted, a contact 7 in the IC card to which the cell 8 is connected the 3-V lithium cell 8 stowed in a cell holder, and a mechanical switch 17 having contacts 17a and 17b.

In FIG. 1, the SRAM 4 is connected to the connector 1 over a data line 10, an address line 11, and a control signal line 12 for use in controlling the chip of the SRAM 4, and writing and reading. Reference numeral 13 denotes a ground terminal. Reference numeral 15 denotes a pull-up resistor.

The structure and movements of the switch 17 will be described below. In FIG. 2, a printed-circuit board 30 in the IC card 100A has contacts A (31), contacts B (32), and common contacts 33. The switch 17 consists of contact springs 17a and 17b and a cam 17c (17d). The cam 17c drawn with a solid line in FIG. 2 indicates the cam at a position at which the contacts A (31) and common contacts 33 are connected. The cam 17d drawn with a dashed line in FIG. 2 indicates the cam at a position at which the contacts B (32) and common contacts 33 are connected.

For demounting and replacing the lithium cell 8 with the IC card 100A unconnected to the system, the contacts 17a and 17b in the switch 17 that are connected to the contacts A for normal operation must be switched to the contacts B. The lithium cell 8 is then replaced with a new one. When the contacts 17a and 17b connected to the contacts A are switched over to the contacts B, the capacitors 5 and 6 connected in parallel with each other are re-connected in series with each other.

At this time, the supply voltage 14 (Vβ) for the SRAM 4 has a maximum value. Thereafter, the supply voltage 14 decreases. Assuming that the initial voltage supplied from the lithium cell 8 is Vb (volt), the capacitance of the capacitor 5 is C1 (farad), the capacitance of the capacitor 6 is C2 (farad), the internal equivalent resistance of the SRAM

4

4 is R (ohm), and elapsed time is t (second), if the capacitances C1 and C2 are equal to the capacitance C, the supply voltage 14 is discharged according to the formula 2 below. The formula 2 is plotted as a curve Vβ in FIG. 12.

$$V\beta = 2V_b e^{-2t/CR} \qquad (2)$$

Assuming that the minimum voltage required for the SRAM 4 to retain data is Vm (volt), an IC card user must replace the lithium cell 8 by the time instant t1' at which the supply voltage 14 for the SRAM 4 that initially equals 2 Vb reaches the voltage Vm. Even if the voltage Vb already equals the voltage Vm with the passage of zero time t, a certain minimum time is ensured for the time interval t1' during which the cell 8 must be replaced.

The time interval t1 required for the supply voltage 14 for the SRAM 4 to reach the minimum voltage Vm needed for retaining data in the known IC card will be compared with the time interval t1' in the first embodiment. The time intervals t1 and t1' are expressed as the formulae 3 and 4 on the basic of the formulae 1 and 2.

$$t1 = CR * \ln(Vb/Vm) \qquad (3)$$

$$t1' = (CR/2) * \ln(2Vb/Vm) \qquad (4)$$

Assuming that the capacitances C of the capacitors 5 and 6 are 10 microfarads (μF), the internal equivalent resistance R of the SRAM 4 is 10 megaohms (MΩ), the initial voltage Vb at the lithium cell 8 is 2.5 volts (although the initial voltage a the lithium cell 8 is 3 volts, the lithium cell 8 shall be replaced with 2.5 volts left), and the minimum voltage Vm required for retaining data is 2 volts, t1 he time interval t1 is 22.3 seconds and the time t1' is 45.18 seconds.

According to the first embodiment, the switch 17 is used to change the connection between the two capacitors 5 and 6, which are connected in parallel with the lithium cell 8, from parallel connection to series connection. That is to say, a certain minimum time is ensured for retaining high voltage. Eventually, data loss occurring during cell replacement is prevented. Specifically, the series circuit composed of the capacitors 5 and 6 serves as a backup power source during replacement of the lithium cell 8. The time available for cell replacement can be made longer, and eventually data loss can be prevented.

Second Embodiment

Figure 3:
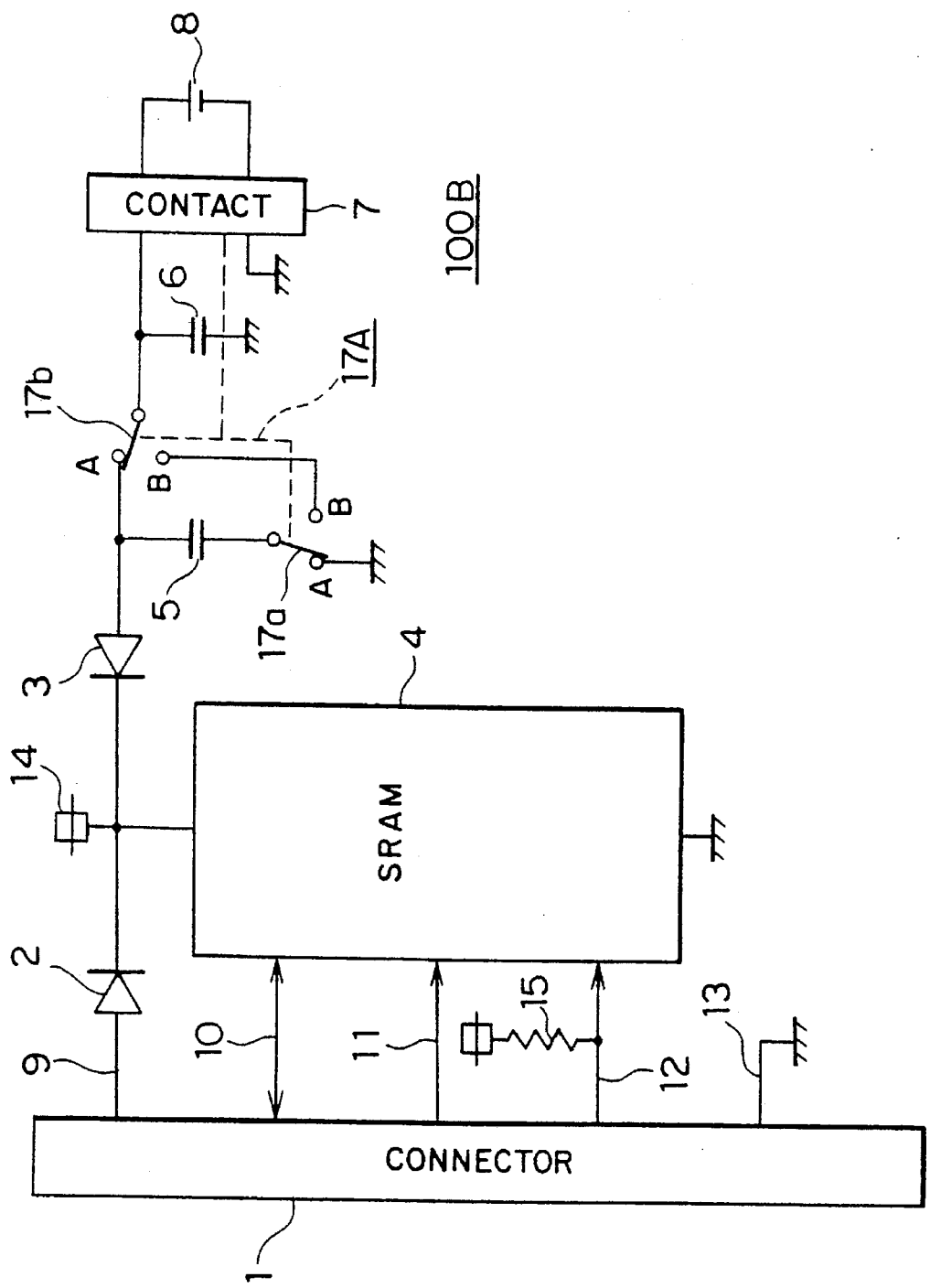
FIG. 3 shows the circuitry of an IC card in accordance with a second embodiment of the present invention.
Figure 4:
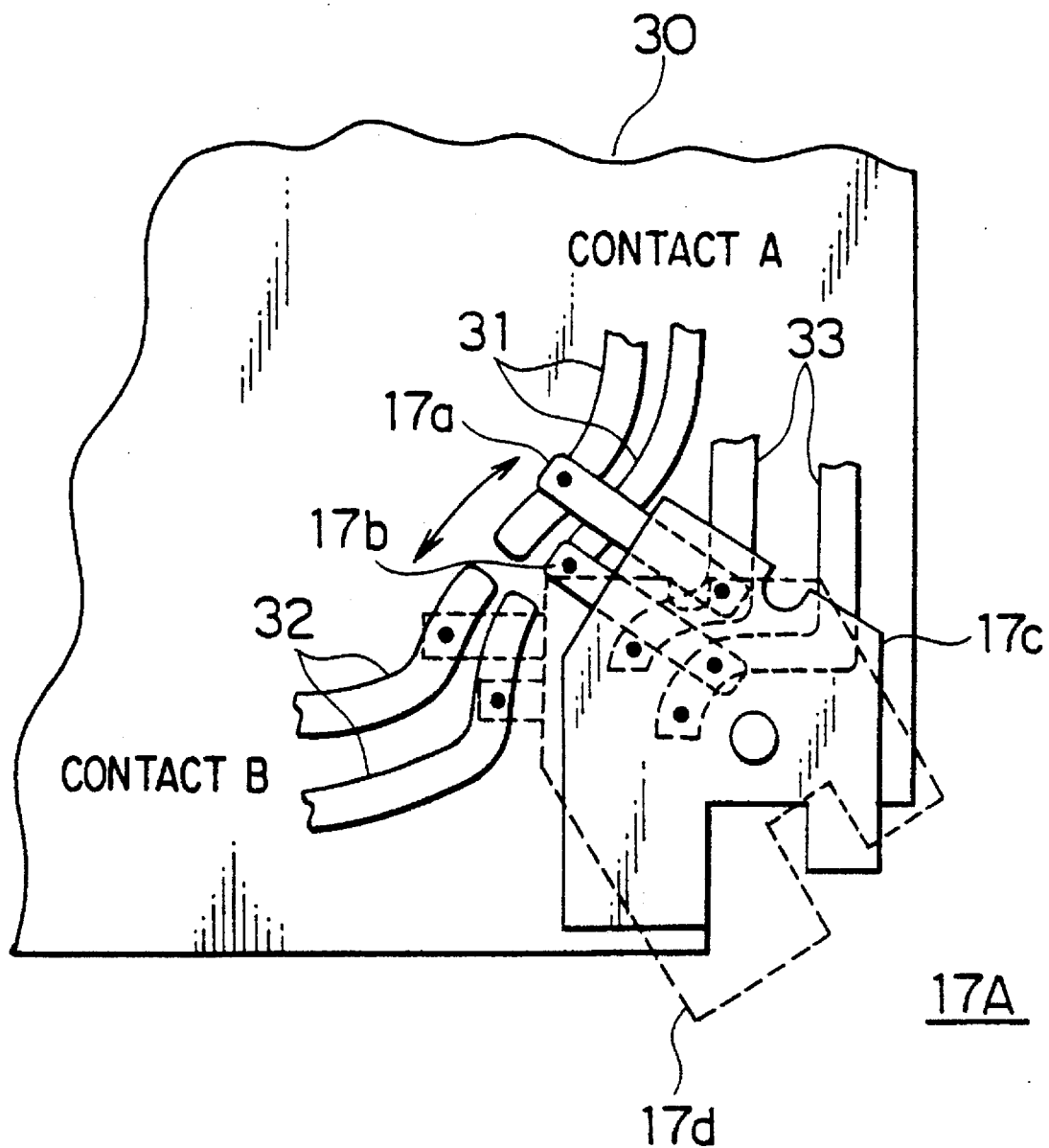
FIG. 4 shows the structure of a switch in the second embodiment of the present invention.
Figure 5:
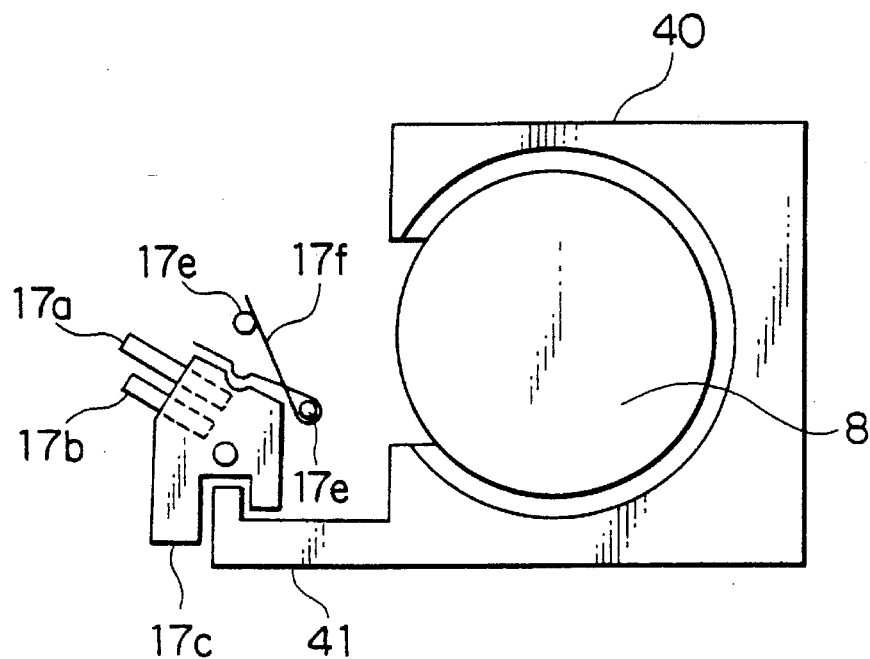
FIG. 5 shows a changed state of the switch in the second embodiment of the present invention.
Figure 6:
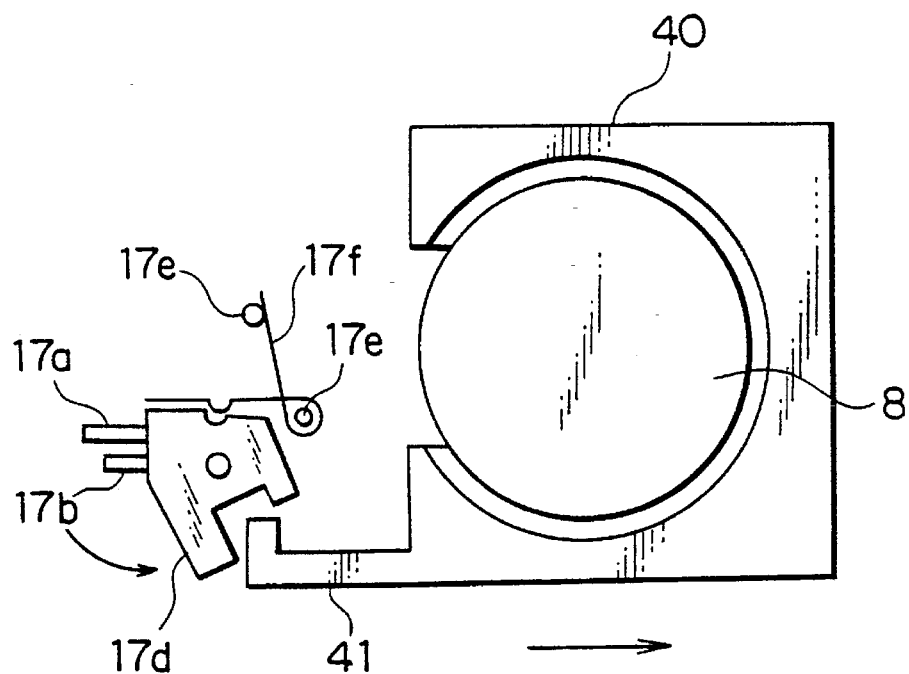
FIG. 6 shows the changed state of the switch in the second embodiment of the present invention.

Referring to FIGS. 3 to 6, a second embodiment of the present invention will be described. FIG. 3 shows the circuitry of the second embodiment of the present invention. FIGS. 4, 5, and 6 show the structure and movements of a switch in the second embodiment.

In the first embodiment, switching of the contacts 17a and 17b in the switch 17 is not interlocked with removal of the cell 8. In the second embodiment, as illustrated, the removal of the cell 8 is interlocked with the switching of the contacts 17a and 17b in the switch 17A. This makes it possible to reliably boost voltage in the same manner as in the first embodiment, and to improve the effect of preventing data loss from occurring during cell replacement.

The structure and movements of the switch 17A will be described below in FIGS. 4, 5, and 6, the printed-circuit board 30 in an IC card 100B has the contacts A (31), contacts B (32), and common contacts 33. The switch 17A consists of the contact springs 17a and 17b, cam 17c (17d), and two supporting 17e for supporting a blade spring 17f. The cam 17c drawn with a solid line in FIG. 4 indicates a cam positioned with a cell holder 40 inserted, while the cam 17d drawn with a dashed line in FIG. 4 indicates the cam positioned with the cell holder 40 removed.

FIG. 5 shows a state in which the cell holder 40 accommodating the lithium cell 8 is inserted in the IC card 100B. The cam 17c s pushed up against the repulsion of the blade spring 17f by means of a projection 41 of the cell holder 40. This causes the contacts 17a and 17b fixed to the cam 17c to connect the contacts A (31) and common contacts 33.

FIG. 6 sows a state in which the cell holder 40 accommodating the lithium cell 8 is removed from the IC card 100B. The cam 17d is pushed down due to the repulsion of the blade spring 17f because it is not pushed up any longer by the projection 41 of the cell holder 40. This causes the contacts 17a and 17b fixed to the cam 17d to link the contacts B (32) and common contacts 33.

In other words, when the lithium cell 8 is removed, the switch 17A connects, in interlocked fashion, the capacitors 5 and 6 in series with each other. An intended object can be accomplished merely by performing the simple work of demounting cell.

Third Embodiment

Figure 7:
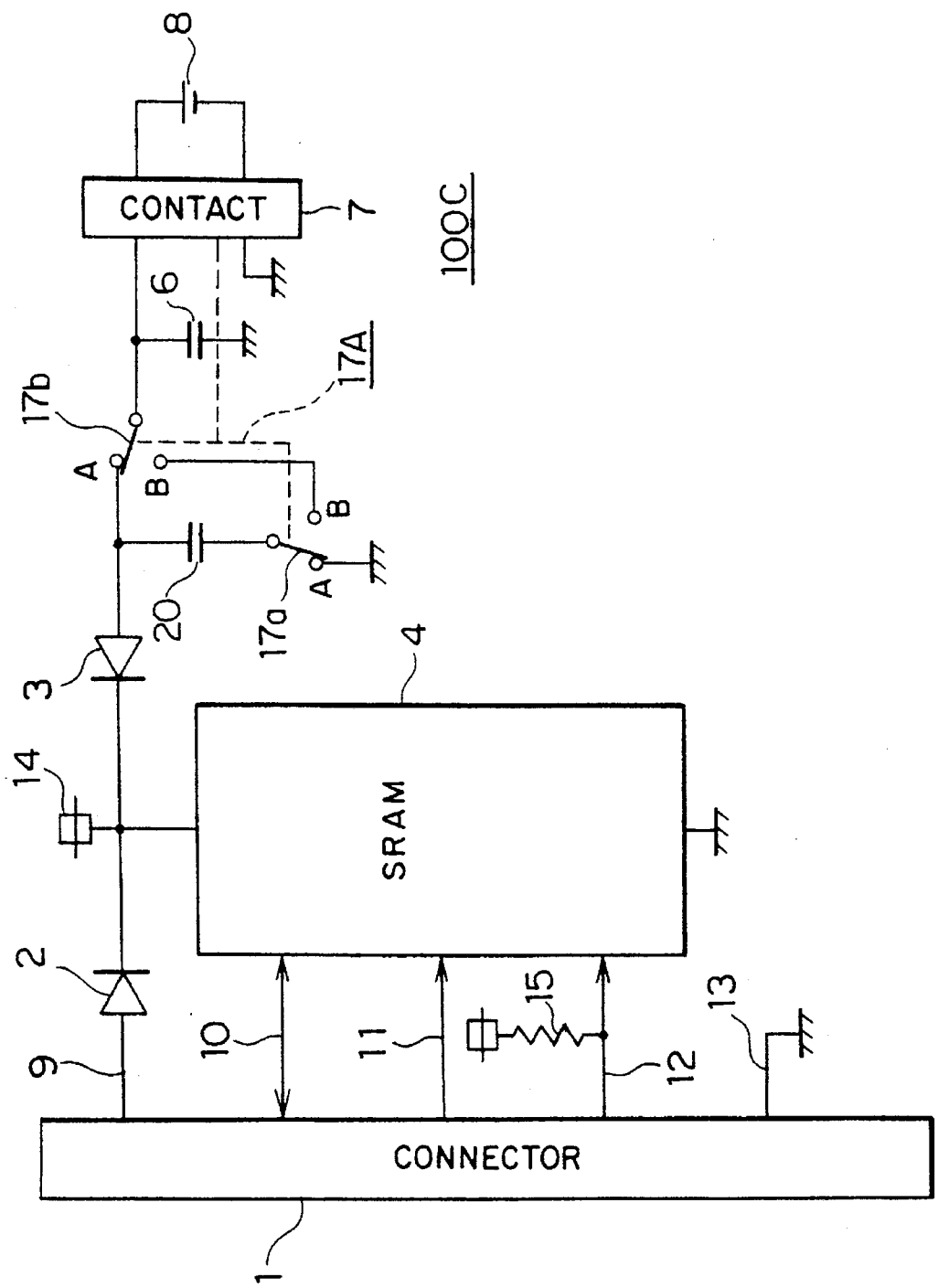
FIG. 7 shows the circuitry of an IC card in accordance with a third embodiment of the present invention.

Referring to FIG. 7, a third embodiment will be described below. FIG. 7 shows the circuitry of the third embodiment of the resent invention.

As shown in FIG. 7, an IC card 100C includes a 3-V secondary cell 20 such as a rechargeable nickel-cadmium cell or lithium cell in place of the capacitor 5. The third embodiment has the same advantage as the second embodiment.

The switch 17 in the first embodiment may be used instead of the switch 17A. This variant has the same advantage as the first embodiment.

Fourth Embodiment

Referring to FIG. 8, a fourth embodiment of the present invention will be described. FIG. 8 shows the circuitry of the fourth embodiment of the present invention.

As shown in FIG. 8, an IC card 100D includes a 3-V secondary cell such as a rechargeable nickel-cadmium cell or lithium cell in place of the capacitor 6 in the second embodiment. The fourth embodiment has the same advantage as the second embodiment.

The switch 17 in the first embodiment may be used instead of the switch 17A. This variant has the same advantage as the first embodiment.

Fifth Embodiment

Referring to FIG. 9, a fifth embodiment of the present invention will be described. FIG. 9 shows the circuitry of the fifth embodiment of the present invention.

As shown in FIG. 9, in an IC card 100E, the current limiting element 3 is interposed between the battery 8 and capacitor 6. When the IC card 100E is connected to the system, the capacitors 5 and 6 are charged by the power supply in the system. When supply voltage in the system is higher than the voltage at the cell 8, the time available for cell replacement is longer than in the other embodiments. However when the power supply in the system is turned oil, if the voltage at the capacitors 5 and 6 becomes lower than the voltage at the cell 8 due to discharging, charge is supplied from the cell 8. The fifth embodiment has substantially the same advantages as the second embodiment.

The switch 17 in the first embodiment may be used instead of the switch 17A. This variant has the same advantage as the first embodiment.

Sixth Embodiment

Referring to FIG. 10, a sixth embodiment of the present invention will be described below. FIG. 10 shows the circuitry of the sixth embodiment of the present invention.

As shown in FIG. 10, in an IC card 100F, the current limiting element 3 is interposed between the switch 17A and capacitor 5 When the IC card 100F is connected to the system, the capacitor 5 is charged by the power supply in the system. When the supply voltage in the system is higher than the voltage at the cell 8, time available for cell replacement is longer than in the first to fourth embodiments. However, when the power supply in the system is turned off, the voltage at the capacitor 5 becomes lower than the one at the cell 8 and charge is supplied from the cell 8. This embodiment has substantially the same advantage as the second embodiment.

The switch 17 in the first embodiment may be used instead of the switch 17A. This variant has the same advantage as the first embodiment.

In the aforesaid embodiments, the number of charge accumulation devices realized with capacitors or secondary cells is two. Alternatively, the number of charge accumulation devices may be three or more. When three or more charge accumulation devices are connected in series with one another, the time available for cell replacement can be made sufficiently long.

What is claimed is:

1. An IC card comprising:

a connector;

a volatile memory connected to said connector for storing data;

a primary cell for supplying power to said memory for data retention;

a first current limiting element for preventing overflow of current from said primary cell via said connector;

a second current limiting element for protecting said primary cell from being charged via said connector a plurality of charge accumulation devices for accumulating charge supplied from said primary cell; and a switch for connecting said plurality of charge accumulation devices in parallel with said primary normal operation and for connecting said plurality of charge accumulation devices in series during replacement of said primary cell.

2. The IC card according to claim 1, wherein said plurality of charge accumulation devices are two capacitors.

3. The IC card according to claim 2, wherein said memory is a static random access memory.

4. The IC card according to claim 2, wherein said plurality of charge accumaltion devices are a secondary cell and a capacitor.

5. The IC card according to claim 4, wherein said memory is a static random access memory.

6. The IC card according to claim 2, wherein said primary cell and said switch are interlocked so that, in order to remove said primary cell for replacement, said switch must be actuated to connect said charge accumulation devices in series.

7. The IC card according to claim 6, wherein said plurality of charge accumulation devices are two capacitors and said memory is a static random access memory.

8. The IC card according to claim 6, wherein said plurality of charge accumulation devices are a secondary cell and a capacitor and said memory a static random access memory.

9. The IC card according to claim 1, wherein said second current limiting element is interposed between said primary cell and said plurality of charge accumulation devices for charging said plurality of charge accumulations devices via said connector.

10. The IC card according to claim 9, including two charge accumulation devices and wherein said memory is a static random access memory.

11. The IC card according to claim 9, wherein said primary cell and said switch are interlocked so that, in order to remove said primary cell for replacement, said switch must be actuated to connect said charge accumulation devices in series.

12. The IC card according to claim 11, wherein said plurality of charge accumulation devices are two capacitors and said memory is a static random access memory.

13. The IC card according to claim 1, wherein said second current limiting element is connected to said plurality of charge accumulation devices so that any of said plurality Of charge accumulation devices can be charged via said connector.

14. The IC card according to claim 13, wherein said plurality of charge accumulation devices are two capacitors and said memory is a static random access memory.

15. The IC card according to claim 13, wherein said primary cell and said switch are interlocked so that, in order to remove said primary cell for replacement, said switch must be actuated to connect said charge accumulation devices in series.

16. The IC card according to claim 15, wherein said plurality of charge accumulation devices are two capacitors and said memory is a static random access memory.

* * * * *

UNITED STATES PATENT AND TRADEMARK OFFICE
CERTIFICATE OF CORRECTION

PATENT NO. : 5,568,441
DATED : October 22, 1996
INVENTOR(S) : Sanemitsu

It is certified that error appears in the above-indentified patent and that said Letters Patent is hereby corrected as shown below:

Column 6, Line 32, after "connector" insert --;--;

Line 36, after "primary" insert --cell for--;

Line 59, after "memory" (first occurrence) insert --is--;

Column 7, Line 11, change "Of" to --of--.

Signed and Sealed this

Eleventh Day of February, 1997

Attest:

BRUCE LEHMAN

Attesting Officer

Commissioner of Patents and Trademarks